(12) United States Patent
Narita

(10) Patent No.: US 11,031,464 B2
(45) Date of Patent: Jun. 8, 2021

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventor: Syunki Narita, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/691,719

(22) Filed: Nov. 22, 2019

(65) Prior Publication Data

US 2020/0235201 A1     Jul. 23, 2020

(30) Foreign Application Priority Data

Jan. 21, 2019   (JP) .............................. JP2019-008086

(51) Int. Cl.
*H01L 21/00*      (2006.01)
*H01L 29/00*      (2006.01)
(Continued)

(52) U.S. Cl.
CPC .......... *H01L 29/063* (2013.01); *H01L 21/046* (2013.01); *H01L 21/049* (2013.01); *H01L 29/1095* (2013.01); *H01L 29/1608* (2013.01); *H01L 29/66068* (2013.01); *H01L 29/7813* (2013.01)

(58) Field of Classification Search
CPC ... H01L 21/046; H01L 21/049; H01L 21/324; H01L 21/26513; H01L 29/1608; H01L 29/063; H01L 29/66068; H01L 29/7813; H01L 29/1095
See application file for complete search history.

(56) References Cited

U.S. PATENT DOCUMENTS 9,997,358 B2 *   6/2018   Wakimoto ............ H01L 21/046
10,128,369 B2 *  11/2018  Takei ................. H01L 29/66734
(Continued)

FOREIGN PATENT DOCUMENTS

JP     2009-283915 A     12/2009
JP     2010-045394 A      2/2010
(Continued)

*Primary Examiner* — Nikolay K Yushin
(74) *Attorney, Agent, or Firm* — Rabin & Berdo, P.C.

(57) ABSTRACT

A silicon carbide semiconductor device includes a first semiconductor layer of a first conductivity type on a semiconductor substrate of the first conductivity type; a second semiconductor layer of a second conductivity type; a first semiconductor region of the first conductivity type; trenches penetrating the second semiconductor layer and the first semiconductor region, and reaching the first semiconductor layer; gate electrodes on gate insulating films in the trenches; a first base region between the trenches; and second base regions at bottoms of the trenches. The first base region includes a lower region equal in thickness to the second base regions and an upper region on the lower region. The first base region has impurity concentration peaks of local maximum values in a thickness direction. A peak nearest an interface between the upper and lower regions is located at a position furthest from any other peak.

6 Claims, 12 Drawing Sheets

(51) Int. Cl.
  *H01L 29/06* (2006.01)
  *H01L 29/16* (2006.01)
  *H01L 29/10* (2006.01)
  *H01L 21/04* (2006.01)
  *H01L 29/66* (2006.01)
  *H01L 29/78* (2006.01)

(56) References Cited

U.S. PATENT DOCUMENTS

| | | | |
|---|---|---|---|
| 10,217,858 B2* | 2/2019 | Hoshi | H01L 29/4236 |
| 2011/0057232 A1 | 3/2011 | Sheppard et al. | |
| 2017/0141223 A1* | 5/2017 | Hoshi | H01L 29/7813 |
| 2017/0221714 A1* | 8/2017 | Wakimoto | H01L 29/4236 |
| 2017/0301789 A1* | 10/2017 | Takei | H01L 29/66068 |
| 2018/0040698 A1 | 2/2018 | Kobayashi et al. | |
| 2018/0197947 A1 | 7/2018 | Iwaya et al. | |

FOREIGN PATENT DOCUMENTS

| | | |
|---|---|---|
| JP | 2018-026562 A | 2/2018 |
| WO | WO-2017/064948 A1 | 4/2017 |

\* cited by examiner

FIG.3

| FIRST p+ -TYPE REGION | 320keV | 160keV | TOTAL DOSE AMOUNT | |
|---|---|---|---|---|
| | 1.13E14 | 6.67E13 | 1.797E14 | |
| SECOND p+ -TYPE REGION | 450keV | 160keV | 30keV | TOTAL DOSE AMOUNT |
| | 1.90E14 | 1.07E14 | 3.58E13 | 3.328E14 |

FIG. 14

| | | | | | | | | TOTAL DOSE AMOUNT |
|---|---|---|---|---|---|---|---|---|
| FIRST p+ -TYPE REGION | 350keV 7.0E13 | 300keV 5.0E13 | 200keV 5.5E13 | 120keV 2.0E13 | | | | 1.95E14 |
| SECOND p+ -TYPE REGION | 450keV 1.00E14 | 350keV 2.00E13 | 300keV 5.00E13 | 200keV 5.50E13 | 120keV 4.50E13 | 60keV 2.50E13 | 30keV 1.50E13 | 3.10E14 |

FIG.15

| FIRST p⁺ -TYPE REGION | 320keV | 160keV | TOTAL DOSE AMOUNT | |
|---|---|---|---|---|
| | 1.13E14 | 6.67E13 | 1.797E14 | |
| SECOND p⁺ -TYPE REGION | 320keV | 150keV | 30keV | TOTAL DOSE AMOUNT |
| | 1.67E14 | 1.07E14 | 3.58E13 | 3.098E14 |

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2019-008086, filed on Jan. 21, 2019, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Conventionally, to reduce element ON resistance in a power semiconductor element, a vertical metal oxide semiconductor field effect transistor (MOSFET) having a trench structure is fabricated (manufactured). In a vertical MOSFET, cell density per unit area may be increased more for a trench structure in which a channel is formed orthogonally to a substrate surface than for a planar structure in which the channel is formed parallel to the substrate surface. Accordingly, a trench structure enables current density per unit area to be increased more than does a planar structure and is more advantageous in terms of cost.

Nonetheless, a vertical MOSFET having a trench structure has a structure in which an entire inner wall region of a trench is covered by a gate insulating film to form the channel in an orthogonal direction and since a bottom portion of the gate insulating film at a bottom of the trench is near a drain electrode, high electric field is easily applied to a portion of the gate insulating film at the bottom of the trench. In particular, since an ultra-high voltage element is fabricated using a wide bandgap semiconductor material (semiconductor material having a bandgap wider than that of silicon, for example, silicon carbide (SiC)), the gate insulating film at the bottom of the trench is adversely affected, thereby greatly reducing reliability.

As a method to solve such problems and to mitigate electric field strength at the bottom of the trench, a structure has been proposed in which a p-type region is formed that is in contact with a p-type base region and reaches a position deeper than is a bottom of a trench, a pn junction is formed at a position deeper than the bottom of the trench and near the trench, and a p-type region is further formed at the bottom of the trench (for example, refer to Japanese Laid-Open Patent Publication No. 2018-26562, International Publication No. WO 2017/064948). Further, use of shallow ion implantation to improve channel sheet resistance to form, for an interface between a channel layer and barrier layer, a concentration distribution having a peak within about 100 Å has been proposed (for example, refer to Japanese Laid-Open Patent Publication No. 2009-283915).

SUMMARY OF THE INVENTION

According to an embodiment of the invention, a semiconductor device includes a semiconductor substrate of a first conductivity type, having a front surface and a rear surface opposite to the front surface; a first semiconductor layer of the first conductivity type, provided on the front surface of the semiconductor substrate, the first semiconductor layer having an impurity concentration lower than an impurity concentration of the semiconductor substrate, and having a first side and a second side opposite to the first side and facing toward the front surface of the semiconductor substrate; a first base region of a second conductivity type, selectively provided in a surface layer at the first side of the first semiconductor layer; second base regions of the second conductivity type, each selectively provided within the first semiconductor layer; a second semiconductor layer of the second conductivity type, provided on the first semiconductor layer at the first side thereof; a first semiconductor region of the first conductivity type, selectively provided in a surface layer of the second semiconductor layer; a plurality of trenches each penetrating the first semiconductor region and the second semiconductor layer, and reaching the first semiconductor layer; a plurality of gate electrodes, each gate electrode being provided in a corresponding one of the trenches, via a gate insulating film; an interlayer insulating film provided on each of the gate electrodes; a first electrode in contact with the second semiconductor layer and the first semiconductor region; and a second electrode provided at a rear surface opposite to the front surface of the semiconductor substrate. The first base region is provided between adjacent two of the trenches, and each of the second base regions is provided at a bottom of a corresponding one of the trenches. The first base region includes a lower region having a thickness equal to a thickness of one of the second base regions, and an upper region provided on the lower region, the lower region being disposed closer to the front surface of the semiconductor substrate than is the upper region, in a thickness direction. The first base region has a plurality of peaks of impurity concentration that are local maximum values in the thickness direction, and among the plurality of peaks, a peak that is nearest an interface between the upper region and the lower region is located at a position furthest from any other peak among the plurality of peaks in the thickness direction.

In the embodiment, among the plurality of peaks of the first base region, a peak nearest the bottom of the trench in the thickness direction is located at a positon furthest from any other peak among the plurality of peaks.

In the embodiment, the second semiconductor layer has a first side and a second side opposite to the first side and facing toward the first side of the first semiconductor layer, and among the plurality of peaks of the first base region, a peak nearest a surface of the second base region, at one side closer to the second side of the second semiconductor layer than is another side opposite the one side of the second base region, is located at a position furthest from any other peak among the plurality of peaks.

According to another embodiment of the invention, a method of manufacturing a semiconductor device includes forming, on a front surface of a semiconductor substrate of a first conductivity type, a first semiconductor layer of a first conductivity type, having an impurity concentration lower than an impurity concentration of the semiconductor substrate; selectively forming, in the first semiconductor layer, a lower region of a first base region a second conductivity type and a second base region of the second conductivity type, the lower region and the second base having respective thicknesses that are the same as each other; forming, on the lower region, an upper region of the first base region; forming, on the first semiconductor layer at a first side thereof, a second semiconductor layer of the second conductivity type, a second side of the first semiconductor layer being opposite to the first side and facing the front surface of the semiconductor substrate; selectively forming in a surface layer of the second semiconductor layer, a first semiconductor region of the first conductivity type; forming a trench that penetrates the first semiconductor region and the second semiconductor layer and reaches the first semiconductor layer; forming, in the trench, a gate electrode via a gate insulating film; forming on the gate electrode, an interlayer insulating film; forming a first electrode in contact with the second semiconductor layer and the first semiconductor region; and forming, at a rear surface of the semiconductor substrate, a second electrode. Forming the upper region includes forming the upper region by three or fewer ion implantation sessions, and setting an acceleration energy of an initial ion implantation session of the three or fewer ion implantation sessions to a value such that implanted ions reach an interface between the upper region and the lower region.

In the embodiment, forming the upper region includes forming a peak of the implanted ions by the initial ion implantation session at a depth in a range of 0.42 μm to 0.53 μm, from a first side of the second semiconductor layer, opposite to a second side that faces toward the first side of the first semiconductor layer.

In the embodiment, forming the upper region includes setting the acceleration energy of the initial ion implantation session to be in a range of 410 keV to 580 keV.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a table depicting dose amount and acceleration energy of ion implantations for forming the first $p^+$-type base region of the silicon carbide semiconductor device according to the embodiment.

FIG. 14 is a table depicting dose amount and acceleration energy of ion implantations for forming the p-type base region of the conventional semiconductor device.

FIG. 15 is a table depicting dose amounts and acceleration energy of the ion implantations after reduction of the number of stages for forming the p-type base region of the conventional semiconductor device.

DETAILED DESCRIPTION OF THE INVENTION

First, problems associated with the conventional techniques will be discussed. Here, the p-type region (hereinafter, first $p^+$-type base region) in contact with the p-type base region and reaching a position deeper than is the bottom of the trench and a p-type region (hereinafter, second $p^+$-type base region) formed at the bottom of the trench are formed by ion implantation. The first $p^+$-type base region is configured by a lower region (hereinafter, first $p^+$-type region) of the first $p^+$-type base region formed concurrently with the second $p^+$-type base region and an upper region (hereinafter, second $p^+$-type region) of the first $p^+$-type base region formed after the first $p^+$-type region.

The first $p^+$-type base region is formed by ion implantations of multiple stages so that an impurity concentration of the first $p^+$-type base region has a box profile (profile in which the impurity concentration is substantially uniform in a depth direction).

Figure 13:
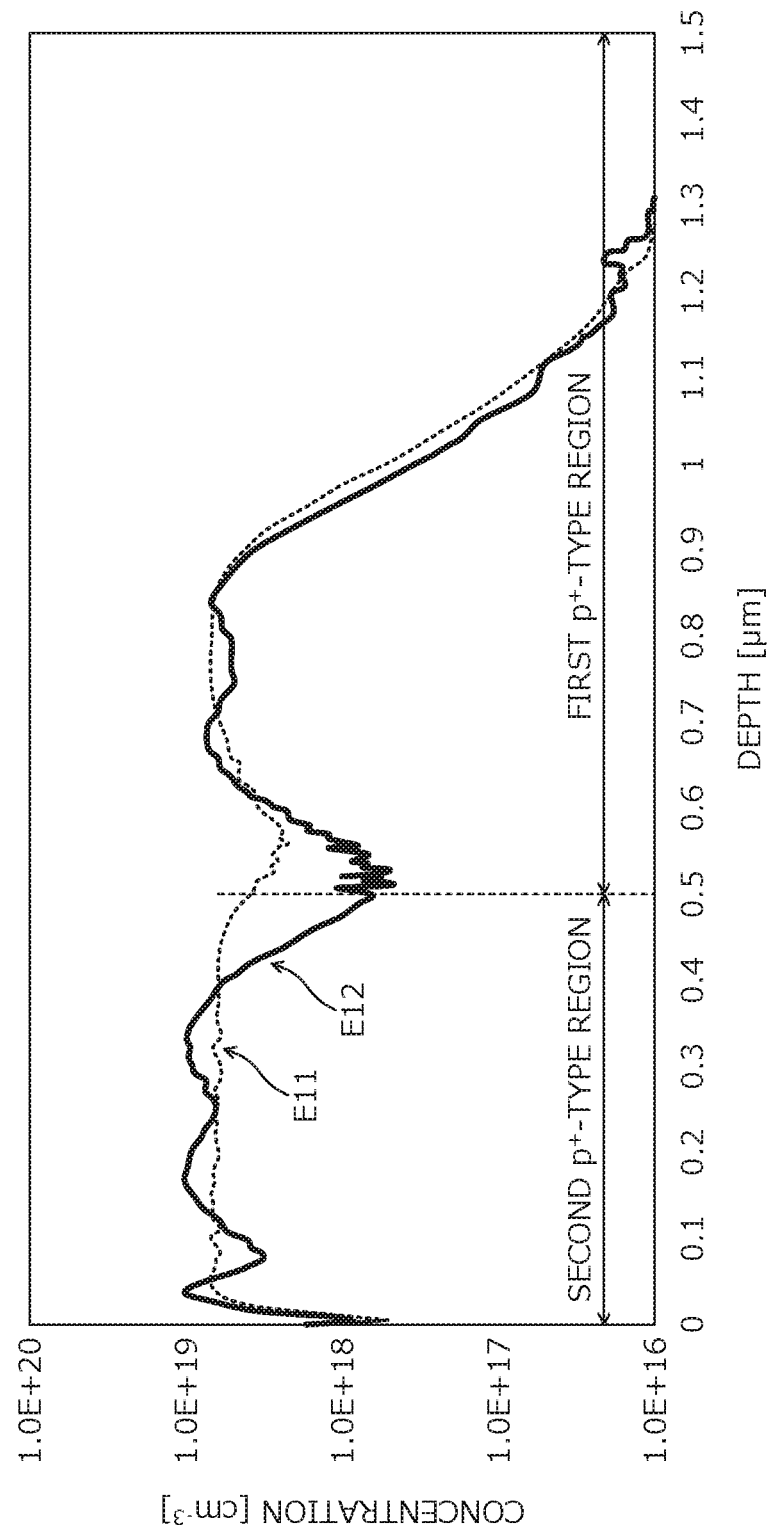
FIG. 13 is a diagram depicting impurity concentration distribution of a p-type base region of a conventional semiconductor device.

FIG. 13 is a diagram depicting impurity concentration distribution of the p-type base region of a conventional semiconductor device. In FIG. 13, a vertical axis indicates impurity concentration of the p-type base region in units of $cm^{-3}$ and a horizontal axis indicates depth of the p-type base region in units of μm. A profile E11 is an impurity concentration distribution of the p-type base region of the conventional semiconductor device, and is a box profile in which the impurity concentration to a depth of 0.9 μm is substantially uniform. To obtain a box profile, for example, in the first $p^+$-type region, ion implantations of four stages is performed and in the second $p^+$-type region, ion implantations of seven stages is performed. FIG. 14 is a table depicting dose amount and acceleration energy of the ion implantations for forming the p-type base region of the conventional semiconductor device. In FIG. 14, the acceleration energy and dose amounts of the ion implantations of each stage are depicted, and the profile E11 is realized by these ion implantations. In FIG. 14, a first row indicates acceleration energy of ion implantations for forming the first $p^+$-type region, a second row indicates dose amounts of the ion implantations and lastly, a total dose amount, a third row indicates acceleration energy of ion implantations for forming the second $p^+$-type region, and a fourth row indicates dose amounts of the ion implantations and lastly, a total dose amount. Further, the ion implantations are performed from the left-hand side to the right-hand side.

On the other hand, to reduce manufacturing time of the first $p^+$-type base region and the second $p^+$-type base region, acceleration energy and the number of stages of the ion implantations are reduced. For example, FIG. 15 is a table depicting dose amounts and acceleration energy of the ion implantations after reduction of the number of stages for forming the p-type base region of the conventional semiconductor device. In FIG. 15, a first row indicates acceleration energy of the ion implantations for forming the first $p^+$-type region, a second row indicates dose amounts in the ion implantations and lastly, a total dose amount, a third row indicates acceleration energy of the ion implantations for forming the second $p^+$-type region, and a fourth row indicates dose amounts of the ion implantations and lastly, a total dose amount. Further, the ion implantations are performed from the left-hand side to the right-hand side.

As depicted in FIG. 15, in the first $p^+$-type region, ion implantations of two stages are performed and in the second $p^+$-type region, ion implantations of three stages performed. For example, in the first stage after reduction of the number of stages, the acceleration energy is between the first and the second stages before reduction of the number of stages and the dose amount is a value obtained by adding the dose amount of the first and the second stages before reduction of the number of stages, and thus, is substantially equivalent to reducing the total dose amount.

However, the impurity concentration of the first $p^+$-type base region formed by the ion implantation after reduction of the number of stages has a profile E12 in FIG. 13 and at an interface between the first $p^+$-type region and the second $p^+$-type region, the impurity concentration decreases significantly. In this case, when a region is present in which the impurity concentration is significantly depressed, ON resistance increases and forward voltage Vf of a built-in diode increases. Further, the first $p^+$-type region and the second $p^+$-type region are not electrically connected and therefore, the first $p^+$-type region is floating and avalanche breakdown decreases. In this manner, when the number of stages of the ion implantation is decreased, the impurity concentration at the interface between the first $p^+$-type region and the second $p^+$-type region decreases significantly, whereby characteristics of the semiconductor device degrade.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, −− appended to p means that the impurity concentration is lower than that of p-type layers and regions appended with −. Further, in the present description, when Miller indices are described, "−" means a bar added to an index immediately after the "−", and a negative index is expressed by prefixing "−" to the index.

Figure 1:
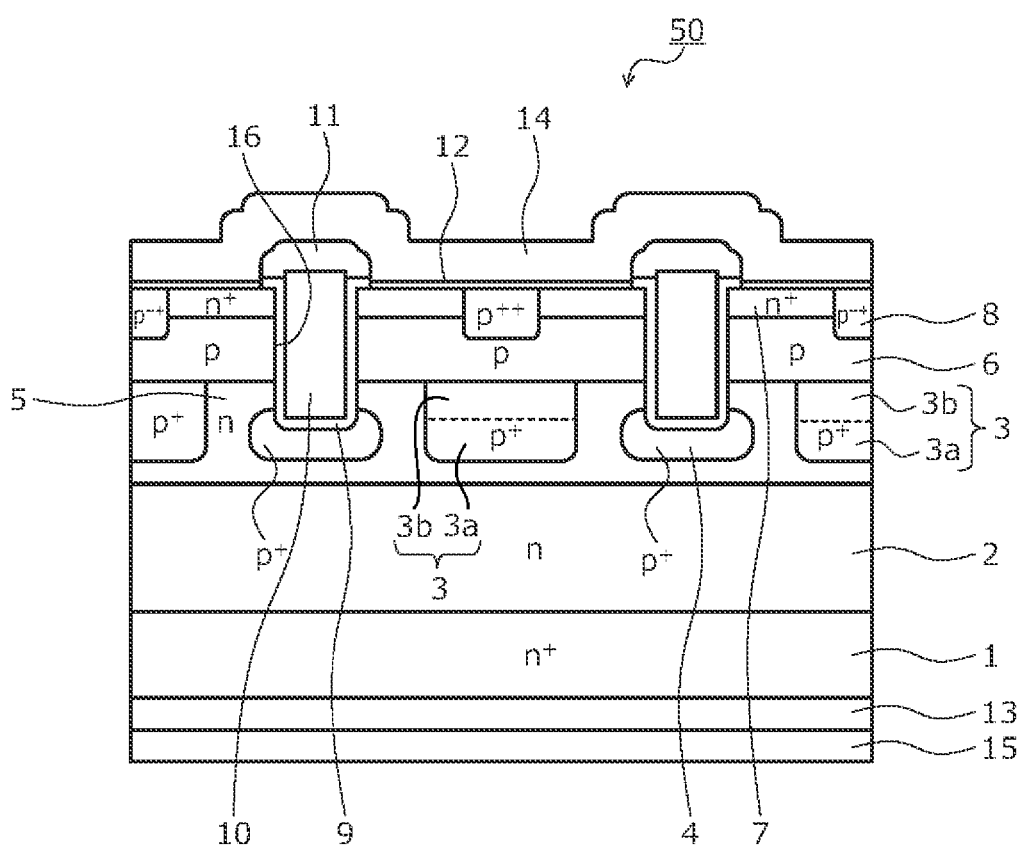
FIG. 1 is a cross-sectional view of a structure of a silicon carbide semiconductor device according to an embodiment.

A semiconductor device according to an embodiment of the invention is configured using a wide bandgap semiconductor. In the embodiment, a silicon carbide semiconductor device fabricated using, for example, silicon carbide (SiC) as the wide bandgap semiconductor will be described taking a MOSFET as an example. FIG. 1 is a cross-sectional view of a structure of a silicon carbide semiconductor device according to the embodiment. FIG. 1 depicts an example of a trench-type MOSFET 50.

As depicted in FIG. 1, in the silicon carbide semiconductor device according to the embodiment, an n-type silicon carbide epitaxial layer (first semiconductor layer of the first conductivity type) 2 is deposited on a first main surface (front surface), for example, a (0001) plane (Si-face), of an $n^+$-type silicon carbide substrate (semiconductor substrate of a first conductivity type) 1.

The $n^+$-type silicon carbide substrate 1 is a silicon carbide single crystal substrate doped with, for example, nitrogen (N). The n-type silicon carbide epitaxial layer 2 is a low-concentration n-type drift region doped with, for example, nitrogen and having an impurity concentration lower than that of the $n^+$-type silicon carbide substrate 1. An n-type high-concentration region (high-impurity-concentration region of the first conductivity type) 5 may be formed at a surface side of the n-type silicon carbide epitaxial layer 2, opposite a side of the n-type silicon carbide epitaxial layer 2 toward the $n^+$-type silicon carbide substrate 1. The n-type high-concentration region 5 is a high-concentration n-type drift layer doped with, for example, nitrogen and having an impurity concentration lower than that of the $n^+$-type silicon carbide substrate 1 and higher than that of the n-type silicon carbide epitaxial layer 2. At a base first main surface side of the n-type silicon carbide epitaxial layer 2, a p-type base layer (second semiconductor layer of a second conductivity type) 6 is provided. Hereinafter, the $n^+$-type silicon carbide substrate 1, the n-type silicon carbide epitaxial layer 2, and the p-type base layer 6 collectively are a silicon carbide semiconductor base.

As depicted in FIG. 1, at a second main surface (rear surface, i.e., rear surface of the silicon carbide semiconductor base) of the $n^+$-type silicon carbide substrate 1, a rear electrode (drain electrode, second electrode) 13 is provided. The rear electrode 13 configures the drain electrode. At a surface of the rear electrode 13, a drain electrode pad 15 is provided.

At a first main surface side (p-type base layer side) of the silicon carbide semiconductor base, a trench structure is formed. In particular, a trench 16 penetrates the p-type base layer 6 from a surface of the p-type base layer 6 on a first side (the first main surface side of the silicon carbide semiconductor base) of the p-type base layer 6, opposite a second side of the p-type base layer 6 toward the $n^+$-type silicon carbide substrate 1, and reaches the n-type high-concentration region 5 (when the n-type high-concentration region 5 is not provided, the n-type silicon carbide epitaxial layer 2). Along an inner wall of the trench 16, a gate insulating film 9 is formed at a side wall and bottom of the trench 16, and a gate electrode 10 is formed on the gate insulating film 9 in the trench 16. The gate electrode 10 is insulated from the n-type silicon carbide epitaxial layer 2 and the p-type base layer 6 by the gate insulating film 9. A portion of the gate electrode 10 may protrude from a top (side toward a source electrode pad 14 described hereinafter) of the trench 16, toward the source electrode pad 14.

In a surface layer on a first side (the first main surface side of the silicon carbide semiconductor base) of the n-type high-concentration region 5 (when the n-type high-concentration region 5 is not provided, the n-type silicon carbide epitaxial layer 2), opposite a second side thereof toward the $n^+$-type silicon carbide substrate 1, a first $p^+$-type base region (first base region of the second conductivity type) 3 is selectively provided. The first $p^+$-type base region 3 is separated from the trench 16 and reaches a position deeper toward a drain than is the bottom of the trench 16.

At a position opposing the bottom of the trench 16 in the depth direction, a second p$^+$-type base region (second base region of the second conductivity type) 4 is provided. A width of the second p$^+$-type base region 4 is equal to or wider than a width of the trench 16. The bottom of the trench 16 may reach the second p$^+$-type base region 4 or may be positioned in the n-type high-concentration region 5 (when the n-type high-concentration region 5 is not provided, the n-type silicon carbide epitaxial layer 2) sandwiched between the p-type base layer 6 and the second p$^+$-type base region 4. The first p$^+$-type base region 3 and the second p$^+$-type base region 4 are doped with, for example, aluminum (Al). A structure may be formed in which a portion of the first p$^+$-type base region 3 extends toward the trench and is thereby connected to the second p$^+$-type base region 4. A reason for this is that holes generated when avalanche breakdown occurs at a junction portion between the second p$^+$-type base region 4 and the n-type silicon carbide epitaxial layer 2 are efficiently migrated to a source electrode 12, whereby load to the gate insulating film 9 is reduced and reliability is increased. FIG. 1 depicts a case in which the first p$^+$-type base region 3 and the second p$^+$-type base region 4 are disposed separated from each other (similarly for FIGS. 7 to 11).

The p-type base layer 6 is in contact with the first p$^+$-type base region 3. An impurity concentration of the p-type base layer 6, for example, may be lower than an impurity concentration of the first p$^+$-type base region 3. As a result, a p-type impurity concentration of a portion (the p-type base layer 6) of a base region formed by the first p$^+$-type base region 3 and the p-type base layer 6, the portion where an n-type inversion layer (channel) is formed in an ON state, may be reduced and therefore, gate threshold voltage Vth and ON resistance may be prevented from increasing. Further, since the p-type impurity concentration of a portion (the first p$^+$-type base region 3) of the base region toward the drain may be increased, a predetermined breakdown voltage may be ensured. In the p-type base layer 6, at a base first main surface side thereof, an n$^+$-type source region (first semiconductor region of the first conductivity type) 7 is selectively provided. A p$^{++}$-type contact region 8 may be selectively provided. Further, the n$^+$-type source region 7 and the p$^{++}$-type contact region 8 are in contact with each other.

The n-type high-concentration region 5 may be provided in a region sandwiched between the p-type base layer 6 and the second p$^+$-type base region 4 and in a region sandwiched between the first p$^+$-type base region 3 and the second p$^+$-type base region 4 of the surface layer at the base first main surface side of the n-type silicon carbide epitaxial layer 2, and the n-type high-concentration region 5 is formed to a position deeper than are positions of the first p$^+$-type base region 3 and the second p$^+$-type base region 4. Therefore, a depth (thickness) of the n-type high-concentration region 5 is greater than a depth (thickness) of the first p$^+$-type base region 3 and a depth (thickness) of the second p$^+$-type base region 4. Further, the first p$^+$-type base region 3 and the second p$^+$-type base region 4 may be formed to positions of equal depths. Further, the n-type high-concentration region 5 may be provided to surround the first p$^+$-type base region 3 and the second p$^+$-type base region 4 on sides of the first p$^+$-type base region 3 and the second p$^+$-type base region 4 toward the drain.

In FIG. 1, while only two trench MOS structures are depicted, MOS gate (insulated gate formed by a metal, an oxide film, a semiconductor) structures having a trench structure may be further disposed in parallel.

At an entire surface of the first main surface side of the silicon carbide semiconductor base, an interlayer insulating film 11 is provided covering the gate electrode 10 embedded in the trench. The source electrode (first electrode) 12 is provided in contact with the n$^+$-type source region 7 and the p$^{++}$-type contact region 8 via a contact hole opened in the interlayer insulating film 11. In an embodiment in which the p$^{++}$-type contact region 8 is not provided, the source electrode 12 may be in contact with the n$^+$-type source region 7 and the p-type base layer 6 via a contact hole opened in the interlayer insulating film 11. The source electrode 12 is electrically insulated from the gate electrode 10 by the interlayer insulating film 11. On the source electrode 12, the source electrode pad 14 is provided.

Figure 2:
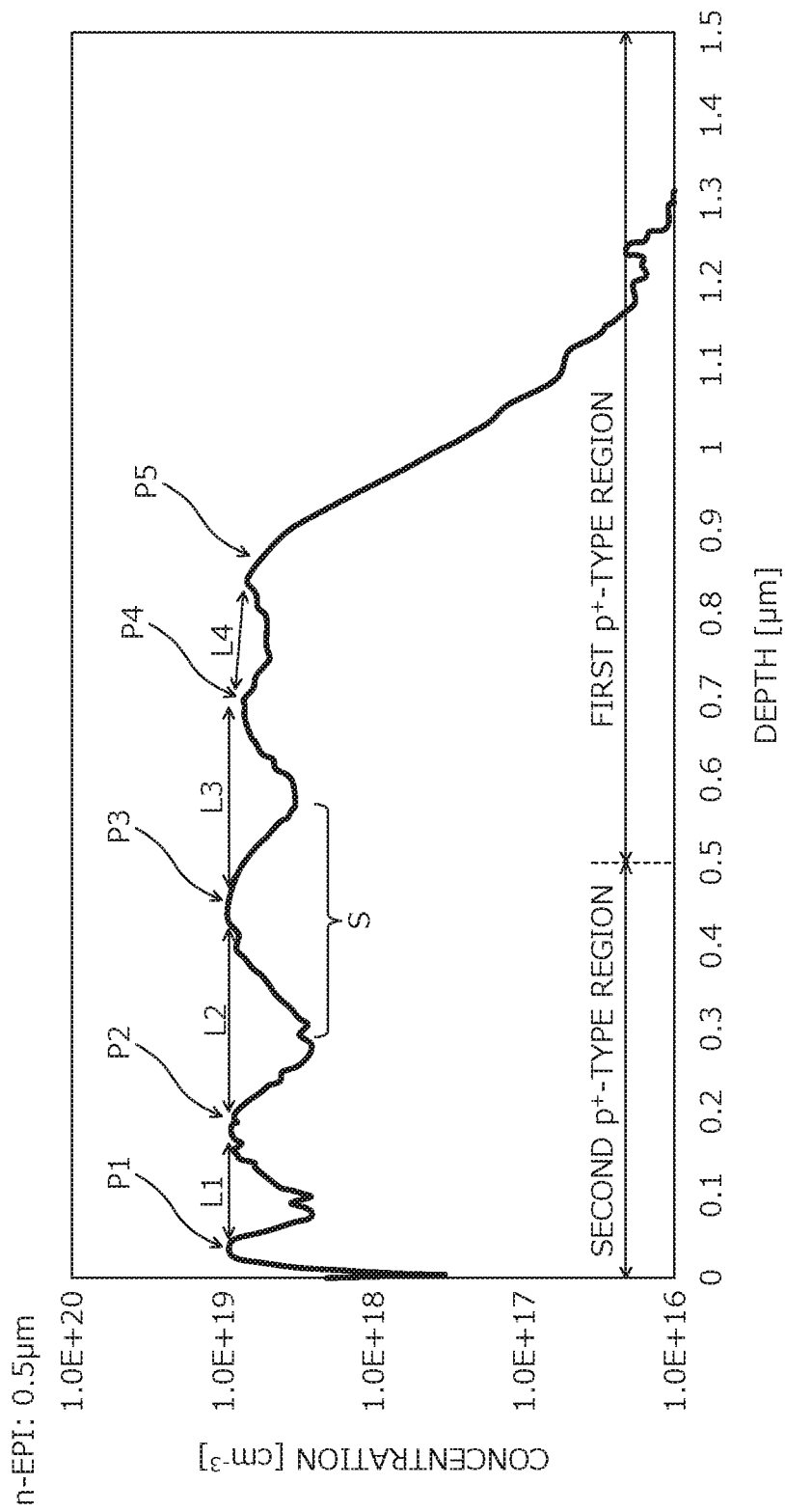
FIG. 2 is a diagram depicting impurity concentration distribution of a first $p^+$-type base region of the silicon carbide semiconductor device according to the embodiment.

FIG. 2 is a diagram depicting impurity concentration distribution of the first p$^+$-type base region of the silicon carbide semiconductor device according to the embodiment. In FIG. 2, a vertical axis indicates impurity concentration the first p$^+$-type base region 3 in units of cm$^{-3}$ and a horizontal axis indicates depth from the p-type base layer 6 in units of μm. The first p$^+$-type base region 3 is configured by a first p$^+$-type region 3a that is a lower region of the first p$^+$-type base region 3 formed concurrently with the second p$^+$-type base region 4, and a second p$^+$-type region 3b that is an upper region of the first p$^+$-type base region 3 formed after formation of the first p$^+$-type region 3a.

In the silicon carbide semiconductor device according to the embodiment, the number of stages of the ion implantations when forming the first p$^+$-type base region 3 is reduced from that for the conventional silicon carbide semiconductor device. Therefore, the first p$^+$-type region 3a and the second p$^+$-type region 3b have multiple peaks where the impurity concentration is a local maximum value and do not have a box profile. For example, in the example depicted in FIG. 2, the first p$^+$-type region 3a has two peaks P4, P5 and the second p$^+$-type region 3b has three peaks P1, P2, P3.

In the embodiment, the peak P3 is provided near an interface between the first p$^+$-type region 3a and the second p$^+$-type region 3b. Impurity concentration at the interface between the first p$^+$-type region 3a and the second p$^+$-type region 3b is prevented from decreasing by the peak P3 even when the number of stages of the ion implantation is reduced. For example, in the ion implantation for forming the second p$^+$-type region 3b, the peak P3 may be formed near the interface between the first p$^+$-type region 3a and the second p$^+$-type region 3b by increasing the acceleration energy of the first stage and deeply implanting the ions.

Further, since the peak P3 is formed by ion implantation with a highest acceleration energy and large dose amount, a mountain-like shape (region S in FIG. 2) that includes the peak P3 is the largest of mountain-like shapes that include other peaks. Therefore, the peak P3 is separated furthest from the other peaks. In other words, a distance L2 between the peak P2-the peak P3 is greater than a distance L1 between the peak P1-the peak P2 (L2>L1), and a distance L3 between the peak P3-the peak P4 is greater than a distance L4 between the peak P4-the peak P5 (L3>L4). Further, the peak P1 and the peak P2 are provided to prevent depression of the impurity concentration of the second p$^+$-type region 3b overall.

FIG. 3 is a table depicting dose amount and acceleration energy of the ion implantations for forming the first p$^+$-type base region of the silicon carbide semiconductor device according to the embodiment. In FIG. 3, acceleration energy and dose amounts of the ion implantations of each stage are depicted, and an impurity profile depicted in FIG. 2 is realized by these ion implantations.

In FIG. 3, a first row indicates acceleration energy of the ion implantations for forming the first $p^+$-type region $3a$, a second row indicates dose amounts of the ion implantations and lastly, a total dose amount. The ion implantations are performed from the left-hand side to the right-hand side. Therefore, the peak P5 is formed by the ion implantation of the first stage at 320 keV, and the peak P4 is formed by the ion implantation of the second state at 160 keV. Further, in FIG. 3, a third row indicates acceleration energy of ion implantations for forming the second $p^+$-type region $3b$, and a fourth row indicates dose amounts of the ion implantations and lastly, a total dose volume. The ion implantations are performed from the left-hand side to the right-hand side. The peak P3 is formed by the ion implantation of the first stage at 450 keV, the peak P2 is formed by the ion implantation of the second stage at 160 keV, and the peak P5 is formed by the ion implantation of the third stage at 30 keV.

As depicted in FIG. 3, in the embodiment, the acceleration energy and the dose amount of the first stage of the second $p^+$-type region are greater than the acceleration energy and the dose amount of the first stage of the second $p^+$-type region in FIG. 15 after the reduction of the number of stages, and the ions are implanted deeper.

Figure 4:
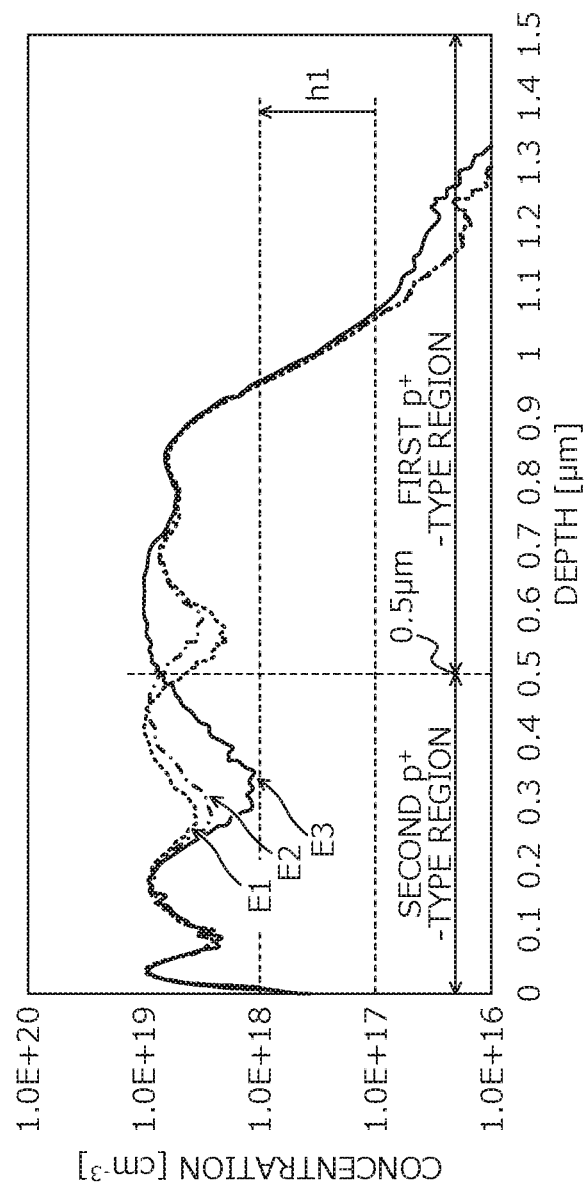
FIG. 4 is a diagram depicting impurity concentration distribution of the first $p^+$-type base region, at the acceleration energies of the ion implantations of the silicon carbide semiconductor device according to the embodiment.
Figure 5:
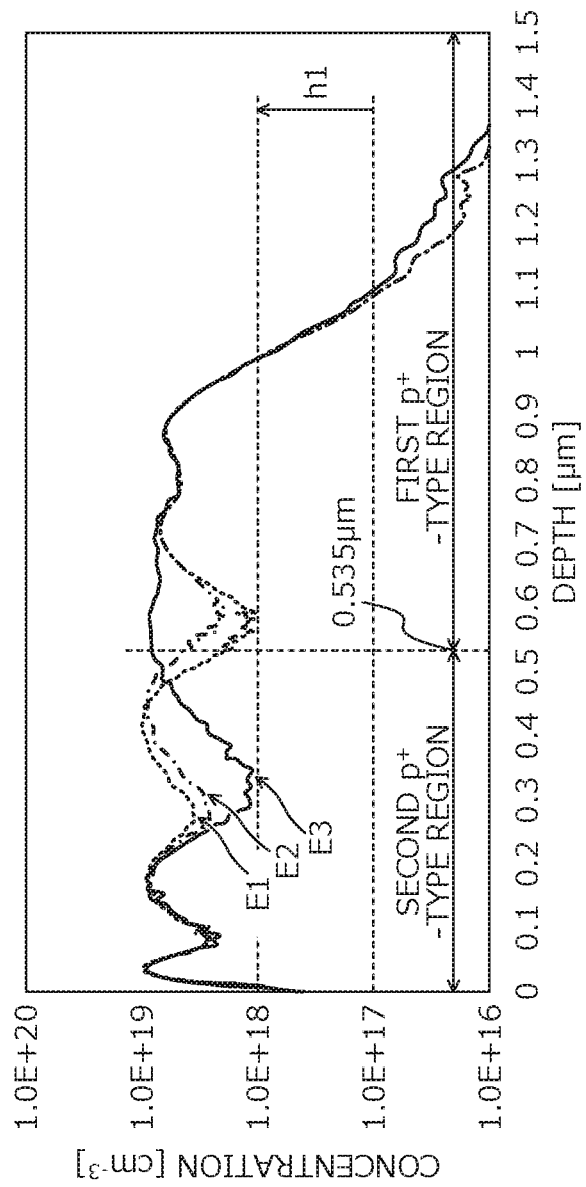
FIG. 5 is a diagram depicting impurity concentration distribution of the first $p^+$-type base region, at the acceleration energies of the ion implantations of the silicon carbide semiconductor device according to the embodiment.

FIGS. 4 and 5 are diagrams depicting impurity concentration distribution of the first $p^+$-type base region, at the acceleration energies of the ion implantations of the silicon carbide semiconductor device according to the embodiment. In FIGS. 4 and 5, a vertical axis indicates impurity concentration of the first $p^+$-type base region 3 in units of $cm^{-3}$ and a horizontal axis indicates depth from the p-type base layer 6 in units of μm.

FIG. 4 indicates impurity concentration distribution for a case where a thickness of the second $p^+$-type region $3b$ is 0.5 μm. Further, FIG. 5 indicates impurity concentration distribution for a case where the thickness of the second $p^+$-type region $3b$ is 0.535 μm. The second $p^+$-type region $3b$ is formed by ion implantation at portions of a second n-type region $5b$ (refer to FIG. 8) of the n-type high-concentration region 5. While the second n-type region $5b$ is formed to have a thickness of 0.5 μm, the second n-type region $5b$ may be formed slightly thicker, for example, about 0.535 μm and therefore, the second $p^+$-type region $3b$ may be formed thicker than 0.5 μm and may be about 0.535 μm.

Further, in FIGS. 4 and 5, a profile E1 is a case in which the acceleration energy of the ion implantation of the first stage is 410 keV, a profile E2 is a case in which the acceleration energy of the ion implantation of the first stage is 450 keV, and a profile E3 is a case in which the acceleration energy of the ion implantation of the first stage is 580 keV. Further, a peak is formed at a position of a depth of 0.42 μm when the acceleration energy is 410 keV, a peak is formed at a position of a depth of 0.44 μm when the acceleration energy is 450 keV, and a peak is formed at a position of a depth of 0.53 μm when the acceleration energy is 580 keV.

Here, when the impurity concentration of the first $p^+$-type base region 3 is at least ten times the impurity concentration of either the n-type silicon carbide epitaxial layer 2 or the n-type high-concentration region 5, the first $p^+$-type base region 3 functions as a p-type region. Therefore, a minimum value of the impurity concentration of the first $p^+$-type base region 3 has to be set to not fall below ten times the impurity concentration of the n-type silicon carbide epitaxial layer 2 or the n-type high-concentration region 5 (h1 in FIGS. 4 and 5). Even when formed to have a thickness of about 0.535 μm, the minimum value of the impurity concentration of the first $p^+$-type base region 3 has to be set to not drop below ten times the impurity concentration of the n-type silicon carbide epitaxial layer 2 or the n-type high-concentration region 5 (h1 in FIGS. 4 and 5).

In the profiles E1 to E3 in FIGS. 4 and 5, the minimum value of the impurity concentration is at least ten times the impurity concentration of either the n-type silicon carbide epitaxial layer 2 or the n-type high-concentration region 5 and therefore, the position of the peak formed by the ion implantation of the first stage may be formed at a depth in a range from 0.42 μm to 0.53 μm. Therefore, acceleration energy of the ion implantation may be in a range from 410 keV to 580 KeV. The acceleration energy is for a case in which aluminum (Al) is used as an element of the ion implantation and the acceleration energy to position the peak at a depth in a range from 0.42 μm to 0.53 μm differs depending on the element.

Further, when the interface between the first $p^+$-type region $3a$ and the second $p^+$-type region $3b$ is used as a reference of the depth instead of the p-type base layer 6, in a case where the thickness of the second $p^+$-type region $3b$ is 0.5 μm, the depth 0.42 μm is on the p-type base layer side, 0.08 μm from the interface and the depth 0.53 μm is on the $n^+$-type silicon carbide substrate 1 side, 0.03 μm from the interface. Therefore, the position of the peak formed by the ion implantation of the first stage for the second $p^+$-type region $3b$ may be formed between 0.08 μm from the interface, toward the p-type base layer 6 and 0.03 μm from the interface, toward the $n^+$-type silicon carbide substrate 1.

Similarly, when the thickness of the second $p^+$-type region $3b$ is 0.535 μm, the depth 0.42 μm is on the p-type base layer side, 0.115 μm from the interface and the depth 0.53 μm is on the $n^+$-type silicon carbide substrate 1 side, 0.005 μm from the interface. Therefore, the position of the peak formed by the ion implantation of the first stage for the second $p^+$-type region $3b$ may be formed between 0.115 μm from the interface, toward the p-type base layer 6 and 0.005 μm from the interface, toward the $n^+$-type silicon carbide substrate 1.

A method of manufacturing the silicon carbide semiconductor device according to the embodiment will be described. FIGS. 6, 7, 8, 9, 10, and 11 are cross-sectional schematic views of the silicon carbide semiconductor device according to the embodiment during manufacture.

Figure 6:
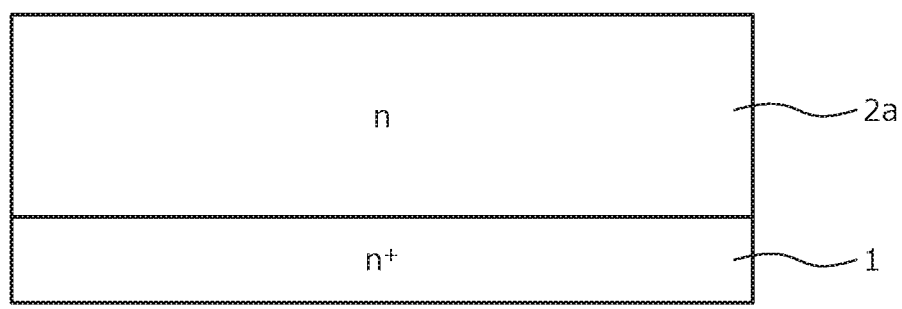
FIG. 6 is a cross-sectional schematic view of the silicon carbide semiconductor device according to the embodiment during manufacture.

First, as depicted in FIG. 6, the $n^+$-type silicon carbide substrate 1 containing silicon carbide of an n-type is prepared. Then, on the first main surface of the $n^+$-type silicon carbide substrate 1, a first n-type silicon carbide epitaxial layer $2a$ containing silicon carbide is formed by epitaxial growth to have a thickness of, for example, about 30 μm while an n-type impurity, for example, nitrogen atoms, is doped. The first n-type silicon carbide epitaxial layer $2a$ forms the n-type silicon carbide epitaxial layer 2. The state up to here is depicted in FIG. 6.

Figure 7:
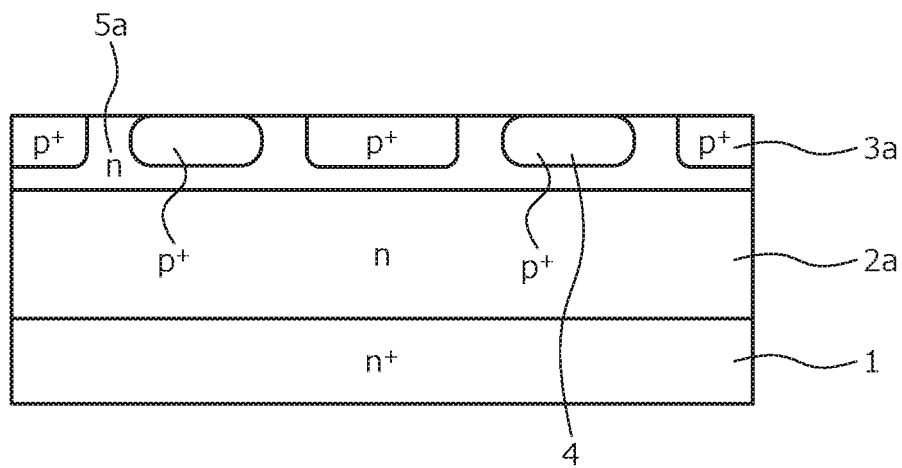
FIG. 7 is a cross-sectional schematic view of the silicon carbide semiconductor device according to the embodiment during manufacture.

Next, as depicted in FIG. 7, on a surface of the first n-type silicon carbide epitaxial layer $2a$, a non-depicted mask having predetermined openings is formed by a photolithographic technique using, for example, an oxide film. Then, a p-type impurity, for example, aluminum atoms, is ion implanted using the oxide film is used as a mask. As a result, as depicted in FIG. 7, at portions of a surface region of the first n-type silicon carbide epitaxial layer $2a$, for example, the second $p^+$-type base region (second base region of the second conductivity type) 4 and the first $p^+$-type region (lower region of the first base region of the second conductivity type) $3a$ of the depth of about 0.5 μm are formed so that, for example, a distance between the first p$^+$-type region 3a and the second p$^+$-type base region 4 that are adjacent to each other is about 1.5 μm. To form the first p$^+$-type region 3a and the second p$^+$-type base region 4, ion implantations of two stages are performed, and the acceleration energy and dose amounts of each are set to the values indicated in FIG. 3.

Next, the mask used during the ion implantations for forming the first p$^+$-type region 3a and the second p$^+$-type base region 4 is removed. Then, an n-type impurity, for example, nitrogen atoms may be ion implanted. As a result, as depicted in FIG. 7, in a surface layer of the first n-type silicon carbide epitaxial layer 2a, a first n-type region 5a is formed between the first p$^+$-type region 3a and the second p$^+$-type base region 4, to a position 0.2 to 0.5 μm deeper than are positions of the first p$^+$-type region 3a and the second p$^+$-type base region 4. Here, ion implantation for forming the first n-type region 5a is performed without use of a mask and therefore, spanning the surface layer of the first n-type silicon carbide epitaxial layer 2a overall, the first n-type region 5a is formed so as to surround lower sides (sides toward the n$^+$-type silicon carbide substrate 1) of the first p$^+$-type region 3a and the second p$^+$-type base region 4. A dose amount during the ion implantation for forming the first n-type region 5a may be set so that, for example, an impurity concentration becomes about $5\times10^{16}/cm^3$. The state up to here is depicted in FIG. 7.

Figure 8:
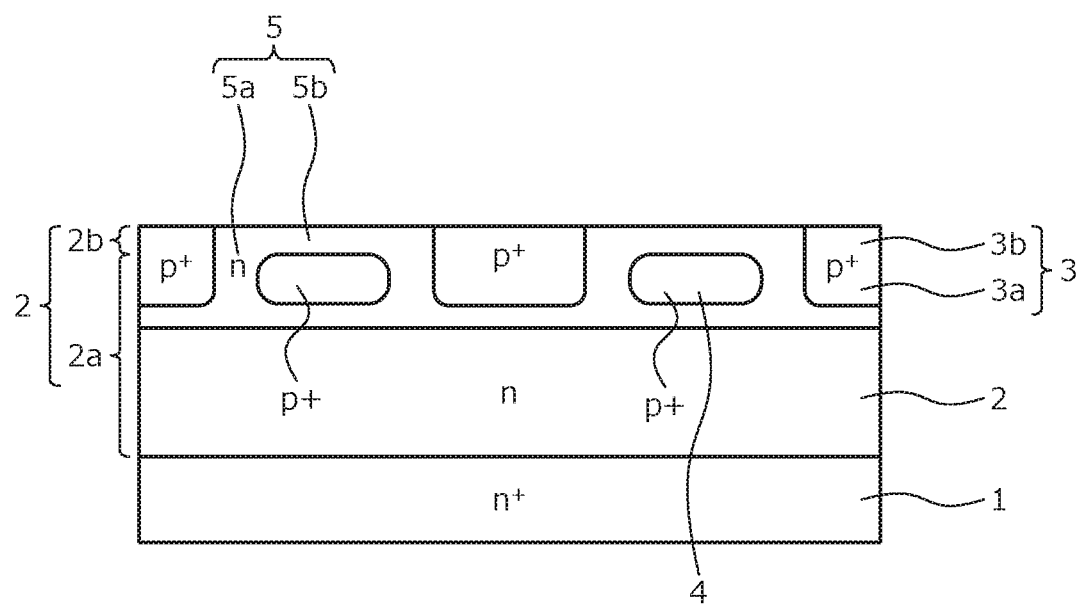
FIG. 8 is a cross-sectional schematic view of the silicon carbide semiconductor device according to the embodiment during manufacture.

Next, as depicted in FIG. 8, on a surface of the first n-type silicon carbide epitaxial layer 2a, a second n-type silicon carbide epitaxial layer 2b is formed by epitaxial growth to have a thickness of, for example, about 0.5 μm while an n-type impurity, for example, nitrogen atoms, is doped. The second n-type silicon carbide epitaxial layer 2b and the first n-type silicon carbide epitaxial layer 2a collectively form the n-type silicon carbide epitaxial layer 2. Conditions of the epitaxial growth for forming the second n-type silicon carbide epitaxial layer 2b, for example, may be set so that an impurity concentration of the second n-type silicon carbide epitaxial layer 2b becomes about $3\times10^{15}/cm^3$.

Next, on a surface of the n-type silicon carbide epitaxial layer 2, a non-depicted mask having predetermined openings is formed by a photolithographic technique using, for example, an oxide film. Then, a p-type impurity, for example, aluminum atoms, is ion implanted using the oxide film as a mask. As a result as depicted in FIG. 8, at portions of a surface region of the n-type silicon carbide epitaxial layer 2, for example, the second p$^+$-type region (upper region of the first base region of the second conductivity type) 3b of the depth of about 0.5 μm, for example, is formed so as to overlap an upper portion of the first p$^+$-type region 3a. The second p$^+$-type region 3b and the first p$^+$-type region 3a collectively form the first p$^+$-type base region 3.

Here, to form the second p$^+$-type region 3b, ion implantations of three stages are performed, and acceleration energy of the first stage is increased so that implanted ions reach a deep position. For example, the acceleration energy of the first stage is set a value so that implanted ions reach the interface between the first p$^+$-type region 3a and the second p$^+$-type region 3b. Here, implanted ions reaching the interface indicate that the interface is included in a mountain-like shape that includes a peak formed by the implanted ions. For example, the mountain-like shape that includes the peak P3 in FIG. 2 includes the interface.

As described, the impurity concentration of the first p$^+$-type base region 3 is at least ten times the impurity concentration of the n-type silicon carbide epitaxial layer 2 or the n-type high-concentration region 5 and therefore, in the ion implantation of the first stage, the peak may be formed at a position of a depth in a range from 0.42 μm to 0.53 μm.

In particular, the acceleration energy and dose amounts of each are set to values such as those indicated in FIG. 3. As a result, at the deep position of the second p$^+$-type region 3b, a peak of the impurity concentration may be near the interface between the second p$^+$-type region 3b and the first p$^+$-type region 3a, and depression of the impurity concentration at the interface between the second p$^+$-type region 3b and the first p$^+$-type region 3a may be prevented. Here, the ion implantations of the plural stages may be performed by performing ion implantations with larger acceleration energies first so that implanted ions do not spread.

Next, the mask used during the ion implantation for forming the second p$^+$-type region 3b is removed. Then, an n-type impurity, for example, nitrogen atoms are ion implanted. As a result, as depicted in FIG. 8, at a portion of a surface layer of the second n-type silicon carbide epitaxial layer 2b, the second n-type region 5b is formed having a thickness of, for example about 0.5 μm, and is in contact with the first p$^+$-type region 3a, the second p$^+$-type base region 4, and the first n-type region 5a. A dose amount during the ion implantation for providing the second n-type region 5b may be set so that, for example, the impurity concentration becomes about $5\times10^{16}/cm^3$. The second n-type region 5b and the first n-type region 5a collectively form the n-type high-concentration region 5. The state up to here is depicted in FIG. 8.

Figure 9:
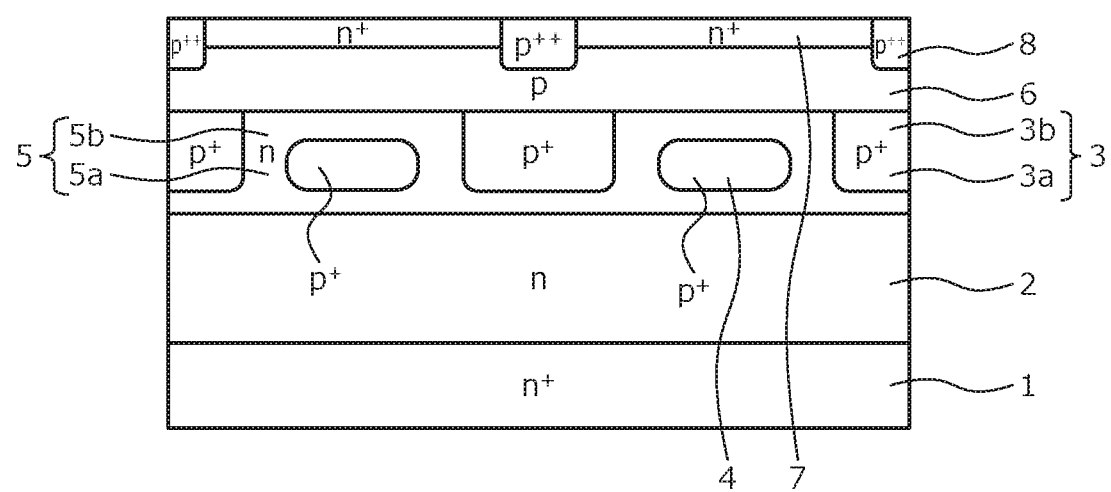
FIG. 9 is a cross-sectional schematic view of the silicon carbide semiconductor device according to the embodiment during manufacture.

Next, as depicted in FIG. 9, on the surface (i.e., surfaces of the first p$^+$-type base region 3 and the second n-type region 5b) of the n-type silicon carbide epitaxial layer 2, the p-type base layer (second semiconductor layer of the second conductivity type) 6 is formed by epitaxial growth to have a thickness of, for example, about 1.3 μm while a p-type impurity, for example, aluminum atoms, is doped. Conditions of the epitaxial growth for forming the p-type base layer 6 may be set so that, for example, the impurity concentration becomes about $4\times10^{17}/cm^3$ lower than the impurity concentration of the first p$^+$-type base region 3. By the processes up to here, silicon carbide semiconductor base is formed in which the n-type silicon carbide epitaxial layer 2 and the p-type base layer 6 are stacked on the n$^+$-type silicon carbide substrate 1.

Next, on the surface of the p-type base layer 6, a non-depicted mask having predetermined openings is formed by a photolithographic technique using, for example, an oxide film. Then, an n-type impurity, for example, phosphorus (P), is ion implanted using the oxide film as a mask. As a result, as depicted in FIG. 9, at portions of the surface layer of the p-type base layer 6, the n$^+$-type source region (first semiconductor region of the first conductivity type) 7 is formed. A dose amount during the ion implantation for forming the n$^+$-type source region 7 may be set so that, for example, the impurity concentration becomes higher than the impurity concentration of the first p$^+$-type base region 3.

Next, the mask used during the ion implantation for forming the n$^+$-type source region 7 is removed. Then, on the surface of the exposed p-type base layer 6, a non-depicted mask having predetermined openings is formed by a photolithography technique using, for example, an oxide film, and using this oxide film as a mask on the surface of the p-type base layer 6, a p-type impurity, for example, aluminum, is ion implanted. As a result, as depicted in FIG. 9, at portions of a surface region of the p-type base layer 6, the p$^{++}$-type contact region 8 is formed. A dose amount during the ion implantation for forming the p$^{++}$-type contact region may be set so that, for example, the impurity concentration becomes higher than the impurity concentration of the second p$^+$-type base region 4. Subsequently, the mask used during the ion implantation for forming the p$^{++}$-type contact region 8 is removed. A sequence in which the ion implantation for forming the n$^+$-type source region 7 and the ion implantation for forming the p$^{++}$-type contact region 8 are performed may be interchanged. The state up to here is depicted in FIG. 9.

Next, a heat treatment (annealing) is performed and, for example, the first p$^+$-type region 3a, the second p$^+$-type region 3b, the n$^+$-type source region 7, and the p$^{++}$-type contact region 8 are activated. A temperature of the heat treatment may be, for example, about 1700 degrees C. A period of the heat treatment may be, for example, about 2 minutes. As described above, ion implanted regions may be activated collectively by one session of the heat treatment, or may be activated by performing the heat treatment each time ion implantation is performed.

Figure 10:
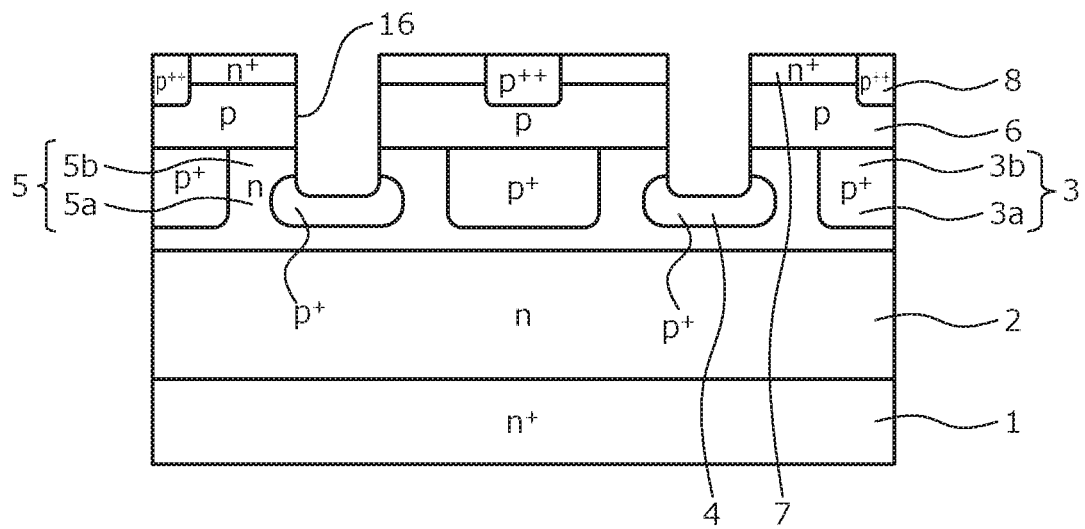
FIG. 10 is a cross-sectional schematic view of the silicon carbide semiconductor device according to the embodiment during manufacture.

Next, as depicted in FIG. 10, on the surface (i.e., surfaces of the n$^+$-type source region 7 and the p$^{++}$-type contact region 8) of the p-type base layer 6, a non-depicted mask having predetermined openings is formed by a photolithographic technique using, for example, an oxide film. Then, by dry etching using the oxide film as a mask, the trench 16 is formed penetrating the n$^+$-type source region 7 and the p-type base layer 6, and reaching the n-type high-concentration region 5 (when the n-type high-concentration region 5 is not formed, the n-type silicon carbide epitaxial layer 2). The bottom of the trench 16 may reach the second p$^+$-type base region 4, or may be positioned in the n-type high-concentration region 5 (when the n-type high-concentration region 5 is not provided, the n-type silicon carbide epitaxial layer 2) between the p-type base layer 6 and the second p$^+$-type base region 4. Subsequently, the mask used for forming the trench 16 is removed. The state up to here is depicted in FIG. 10.

Figure 11:
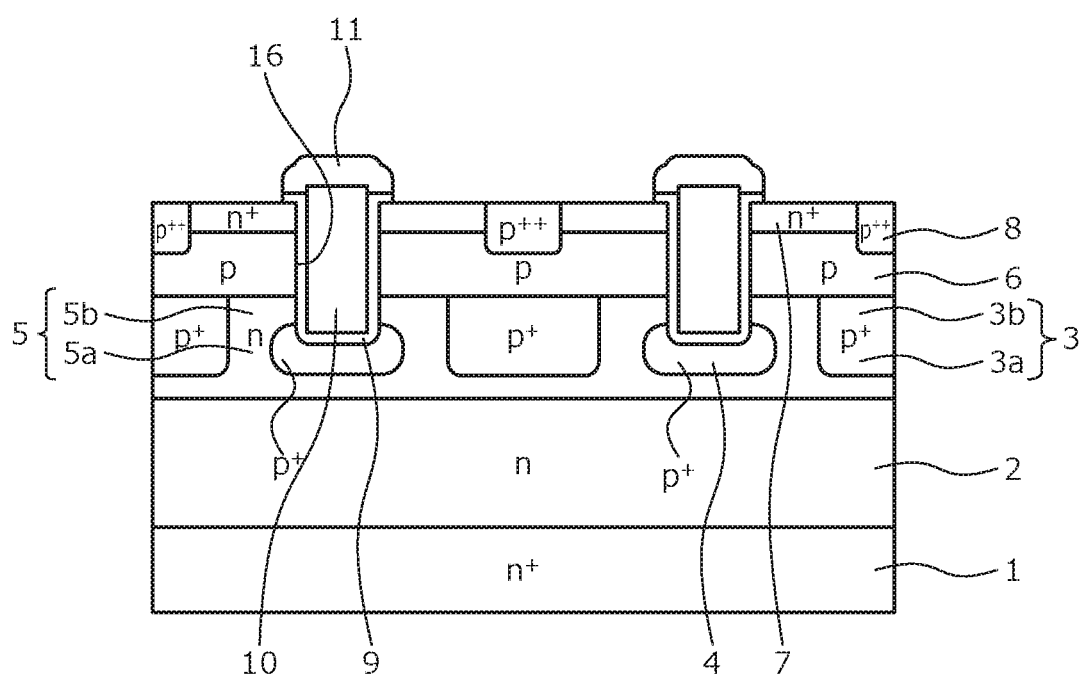
FIG. 11 is a cross-sectional schematic view of the silicon carbide semiconductor device according to the embodiment during manufacture.

Next, as depicted in FIG. 11, along surfaces of the n$^+$-type source region 7 and the p$^{++}$-type contact region 8 and along side walls and the bottom of the trench 16, the gate insulating film 9 is formed. The gate insulating film 9 may be formed by oxidation in an oxygen atmosphere, by a heat treatment at a temperature of about 1000 degrees C. Further, the gate insulating film 9 may be formed by a deposition method by a chemical reaction such as that for a high temperature oxide (HTO).

Next, on the gate insulating film 9, a polycrystalline silicon layer doped with, for example, phosphorus atoms, is formed. The polycrystalline silicon layer is formed so as to be embedded in the trench 16. The polycrystalline silicon layer is patterned and left inside the trench 16, whereby the gate electrode 10 is formed. A portion of the gate electrode 10 may protrude toward the source electrode pad 14, from a top (side toward the source electrode pad 14) of the trench 16.

Next, for example, a phosphate glass is deposited to a thickness of about 1 μm, so as to cover the gate insulating film 9 and each gate electrode 10, thereby forming the interlayer insulating film 11. The interlayer insulating film 11 and the gate insulating film 9 are patterned and selectively removed, thereby forming a contact hole and exposing the n$^+$-type source region 7 and the p$^{++}$-type contact region 8 (when the p$^{++}$-type contact region 8 is not formed, the p-type base layer 6). Thereafter, a heat treatment (reflow) is performed, planarizing the interlayer insulating film 11. The state up to here is depicted in FIG. 11.

Next, for example, by a sputtering method, the source electrode 12 is formed in contact with each n$^+$-type source region 7 and each p$^{++}$-type contact region 8. Next, for example, by a sputtering method, for example, an aluminum film is provided having a thickness of, for example, about 5 μm and covering the source electrode 12 and the interlayer insulating film 11. Thereafter, the aluminum film is selectively removed and left so as to cover an active region of elements overall, whereby the source electrode pad 14 is formed.

Next, for example, by a sputtering method, the drain electrode 13 is formed at the second main surface of the n$^+$-type silicon carbide substrate 1. Next, at a surface of the drain electrode 13, for example, titanium (Ti), nickel (Ni), and gold (Au) are sequentially stacked, whereby the drain electrode pad 15 is formed. In this manner, the semiconductor device depicted in FIG. 1 is completed.

In FIGS. 6 to 11, while a state in which formation of the second n-type region 5b by ion implantation is depicted, the second n-type silicon carbide epitaxial layer 2b may be formed as the second n-type region 5b. In other words, the method of manufacturing may omit ion implantation and the impurity concentration of nitrogen during the epitaxial growth of the second n-type silicon carbide epitaxial layer 2b may be set so as to become about $5 \times 10^{16}$/cm$^3$, which is the impurity concentration of the second n-type region 5b. Further, the n$^+$-type silicon carbide substrate 1 and the n-type silicon carbide epitaxial layer 2 may collectively form the silicon carbide semiconductor base, and the p-type base layer 6 may be formed by ion implantation in the surface layer of the base first main surface side of the n-type silicon carbide epitaxial layer 2. Further, the n$^+$-type silicon carbide substrate 1 alone may form the silicon carbide semiconductor base and all regions (including the n-type high-concentration region 5 and the first p$^+$-type base region 3, the second p$^+$-type base region 4) configuring the MOS gate structure may be formed by ion implantation in the surface layer of the first main surface side of the n$^+$-type silicon carbide substrate 1.

Figure 12:
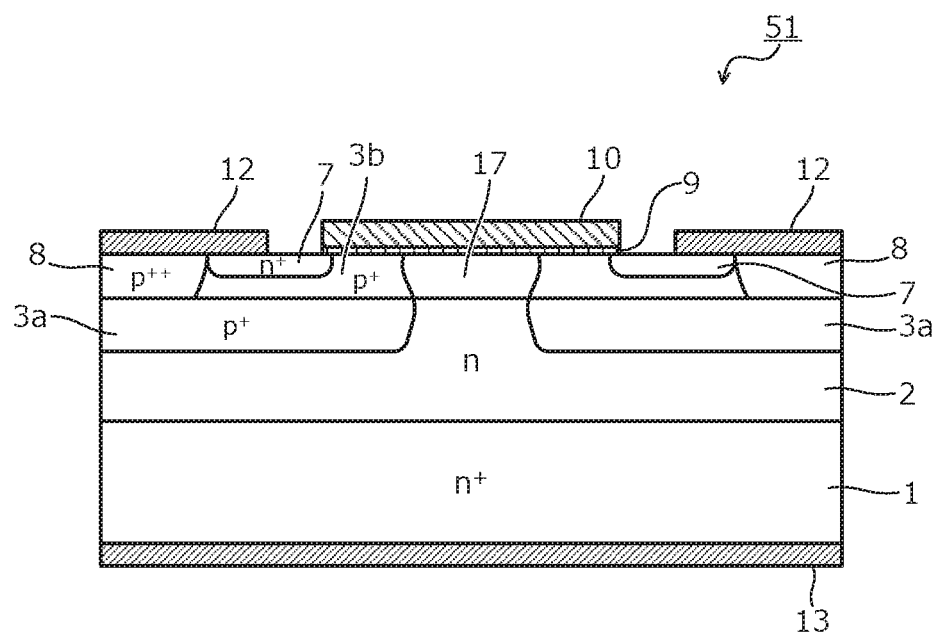
FIG. 12 is a cross-sectional view of another structure of the silicon carbide semiconductor device according to the embodiment.

Further, in the embodiments of the present invention, while description is given taking a trench-type MOSFET as an example, without limitation hereto, application is further possible with respect to semiconductor devices of various configurations such as MOS-type semiconductor devices like IGBTs, planar-type MOSFETs, etc. FIG. 12 is a cross-sectional view of another structure of the silicon carbide semiconductor device according to the embodiment. FIG. 12 depicts an example of a planar-type MOSFET 51.

As depicted in FIG. 12, a semiconductor base layer is prepared in which the n-type silicon carbide epitaxial layer 2 is formed on one surface of the n$^+$-type silicon carbide substrate 1, the first p$^+$-type region 3a is selectively formed at the surface of the n-type silicon carbide epitaxial layer 2, the second p$^+$-type region 3b is selectively formed at the surface of the first p$^+$-type region 3a, and the n$^+$-type source region 7 and the p$^{++}$-type contact region 8 are formed at the surface of the second p$^+$-type region 3b. At surfaces of the n$^+$-type source region 7 and the p$^{++}$-type contact region 8, the source electrode 12 is formed.

Meanwhile, at the n-type silicon carbide epitaxial layer 2, the second p$^+$-type region 3b is not formed, and an n-type region 17 is formed at the surface of the n-type silicon carbide epitaxial layer 2. At surfaces of the n-type region 17 and the second p$^+$-type region 3b between the n-type region 17 and the n$^+$-type source region 7, the gate electrode 10 is formed via the gate insulating film 9. At a rear surface of the n+-type silicon carbide substrate 1, the rear electrode 13 is provided.

Even in the planar-type MOSFET 51 of such a configuration, when the second p+-type region 3b is formed, acceleration energy of the first stage is increased, whereby effects similar to those of trench-type MOSFET may be obtained.

As described above, according to the embodiment, when the first p+-type region is formed by ion implantation, the acceleration energy of the first stage is increased. As a result, the peak of the impurity concentration may be near the interface between the first p+-type region and the second p+-type region. Therefore, even when the number of stages of the ion implantations is reduced, depression of the impurity concentration at the interface between the first p+-type region and the second p+-type region and degradation of characteristics of the semiconductor device may be prevented.

In the embodiments of the invention above, while description is given taking, as an example, a case in which the first main surface of the silicon carbide substrate containing silicon carbide is assumed as a (0001) plane and on the (0001) plane, a MOS gate structure is configured, without limitation hereto, the type (for example, gallium nitride (GaN), etc.) of the wide bandgap semiconductor, surface orientation of the main surface of the substrate, etc. may be variously modified.

Further, while in the embodiments, the first conductivity type is an n-type and the second conductivity type is a p-type, the present invention is similarly implemented when the first conductivity type is a p-type and the second conductivity type an n-type.

As described, according to the invention, when the first p+-type region (upper region of the first base region) is formed by ion implantation, the acceleration energy of the first stage is increased. As a result, the peak of the impurity concentration may be near the interface between the first p+-type region and the second p+-type region (lower region of the first base region). Therefore, even when the number of stages of the ion implantations is reduced, depression of the impurity concentration at the interface between the first p+-type region and the second p+-type region and degradation of the characteristics of the semiconductor device may be prevented.

The semiconductor device and the method of manufacturing a semiconductor device according to the present invention achieve an effect in that even when the number of stages of the ion implantations is reduced, the impurity concentration may be prevented from decreasing.

As described, the semiconductor device and method of manufacturing a semiconductor device of the present invention are useful for high-voltage semiconductor devices used in power converting equipment, and power supply devices of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor substrate of a first conductivity type, having a front surface and a rear surface opposite to the front surface;
   a first semiconductor layer of the first conductivity type, provided on the front surface of the semiconductor substrate, the first semiconductor layer having an impurity concentration lower than an impurity concentration of the semiconductor substrate, and having a first side and a second side opposite to the first side and facing toward the front surface of the semiconductor substrate;
   a first base region of a second conductivity type, selectively provided in a surface layer at the first side of the first semiconductor layer;
   second base regions of the second conductivity type, each selectively provided within the first semiconductor layer;
   a second semiconductor layer of the second conductivity type, provided on the first semiconductor layer at the first side thereof;
   a first semiconductor region of the first conductivity type, selectively provided in a surface layer of the second semiconductor layer;
   a plurality of trenches each penetrating the first semiconductor region and the second semiconductor layer, and reaching the first semiconductor layer;
   a plurality of gate electrodes, each gate electrodes being provided in a corresponding one of the trenches, via a gate insulating film;
   an interlayer insulating film provided on each of the gate electrodes;
   a first electrode in contact with the second semiconductor layer and the first semiconductor region; and
   a second electrode provided at a rear surface opposite to the front surface of the semiconductor substrate, wherein
   the first base region is provided between adjacent two of the trenches, and each of the second base regions is provided at a bottom of a corresponding one of the trenches,
   the first base region includes a lower region having a thickness equal to a thickness of one of the second base regions, and an upper region provided on the lower region, the lower region being disposed closer to the front surface of the semiconductor substrate than is the upper region, in a thickness direction and
   the first base region has a plurality of peaks of impurity concentration that are local maximum values in the thickness direction, and among the plurality of peaks, a peak that is nearest an interface between the upper region and the lower region is located at a position furthest from any other peak among the plurality of peaks in the thickness direction.

2. The semiconductor device according to claim 1, wherein among the plurality of peaks of the first base region, a peak nearest the bottom of the trenches in the thickness direction is located at a positon furthest from any other peak among the plurality of peaks.

3. The semiconductor device according to claim 1, wherein
   the second semiconductor layer has a first side and a second side opposite to the first side and facing toward the first side of the first semiconductor layer, and
   among the plurality of peaks of the first base region, a peak nearest a surface of the second base regions, at one side closer to the second side of the second semiconductor layer than is another side opposite the one side of the second base regions, is located at a position furthest from any other peak among the plurality of peaks.

4. A method of manufacturing a semiconductor device, the method comprising:
  forming, on a front surface of a semiconductor substrate of a first conductivity type, a first semiconductor layer of a first conductivity type, having an impurity concentration lower than an impurity concentration of the semiconductor substrate;
  selectively forming, in the first semiconductor layer, a lower region of a first base region a second conductivity type and a second base region of the second conductivity type, the lower region and the second base having respective thicknesses that are the same as each other;
  forming, on the lower region, an upper region of the first base region;
  forming, on the first semiconductor layer at a first side thereof, a second semiconductor layer of the second conductivity type, a second side of the first semiconductor layer being opposite to the first side and facing the front surface of the semiconductor substrate;
  selectively forming in a surface layer of the second semiconductor layer, a first semiconductor region of the first conductivity type;
  forming a trench that penetrates the first semiconductor region and the second semiconductor layer and reaches the first semiconductor layer;
  forming, in the trench, a gate electrode via a gate insulating film;
  forming on the gate electrode, an interlayer insulating film;
  forming a first electrode in contact with the second semiconductor layer and the first semiconductor region; and
  forming, at a rear surface of the semiconductor substrate, a second electrode, wherein
  forming the upper region includes forming the upper region by three or fewer ion implantation sessions, and setting an acceleration energy of an initial ion implantation session of the three or fewer ion implantation sessions to a value such that implanted ions reach an interface between the upper region and the lower region.

5. The method according to claim 4, wherein forming the upper region includes forming a peak of the implanted ions by the initial ion implantation session at a depth in a range of 0.42 µm to 0.53 µm, from a first side of the second semiconductor layer, opposite to a second side that faces toward the first side of the first semiconductor layer.

6. The method according to claim 4, wherein forming the upper region includes setting the acceleration energy of the initial ion implantation session to be in a range of 410 keV to 580 keV.

* * * * *